United States Patent
Whikehart et al.

(10) Patent No.: US 9,258,011 B2
(45) Date of Patent: Feb. 9, 2016

(54) EFFICIENT TWO-STAGE ASYNCHRONOUS SAMPLE-RATE CONVERTER

(71) Applicant: VISTEON GLOBAL TECHNOLOGIES, INC., Van Buren Township, MI (US)

(72) Inventors: J. William Whikehart, Milford, MI (US); David P. Stewart, Novi, MI (US); Dave Lavacek, Livonia, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 99 days.

(21) Appl. No.: 14/043,509

(22) Filed: Oct. 1, 2013

(65) Prior Publication Data

US 2015/0091743 A1    Apr. 2, 2015

(51) Int. Cl.
| | | |
|---|---|---|
| *H03M 7/00* | (2006.01) | |
| *H03M 5/00* | (2006.01) | |
| *G06F 5/06* | (2006.01) | |
| *H04L 25/05* | (2006.01) | |
| *H04L 27/26* | (2006.01) | |
| *G11B 20/10* | (2006.01) | |
| *H03H 17/06* | (2006.01) | |
| *H03M 7/46* | (2006.01) | |
| *H04L 7/033* | (2006.01) | |
| *H03M 7/30* | (2006.01) | |
| *G10L 19/008* | (2013.01) | |

(52) U.S. Cl.
CPC . *H03M 7/00* (2013.01); *G06F 5/06* (2013.01); *H03H 17/0628* (2013.01); *H03M 5/00* (2013.01); *H04L 25/05* (2013.01); *G10L 19/008* (2013.01); *G11B 20/10527* (2013.01); *H03H 17/0685* (2013.01); *H03M 7/30* (2013.01); *H03M 7/46* (2013.01); *H04L 7/0337* (2013.01); *H04L 27/2647* (2013.01)

(58) Field of Classification Search
CPC ...... H03H 17/0685; H03M 7/46; H03M 7/30; H04L 27/2647; H04L 7/0337; G11B 20/10527; G10L 19/008
USPC ........... 341/61, 63, 60; 375/316, 355; 700/94; 704/500
See application file for complete search history.

(56) References Cited

U.S. PATENT DOCUMENTS

| | | | |
|---|---|---|---|
| 7,218,581 | B2 | 5/2007 | Frisson et al. |
| 7,436,333 | B2 | 10/2008 | Forman et al. |
| 7,478,011 | B2 | 1/2009 | Gebara et al. |
| 2012/0246210 | A1 | 9/2012 | Pan et al. |

*Primary Examiner* — Joseph Lauture
(74) *Attorney, Agent, or Firm* — Klintworth & Rozenblat IP LLC

(57) ABSTRACT

Methods and systems consistent with the present invention provide an improved sample-rate converter that overcomes the limitations of conventional sample-rate converters. The improved system comprises a simple asynchronous sample-rate converter and synchronous sample-rate converter. The output of the simple asynchronous sample-rate converter is connected to the input of the synchronous sample-rate converter. In an alternative embodiment, the output of the synchronous sample-rate converter is connected to the input of the simple asynchronous sample-rate converter.

26 Claims, 8 Drawing Sheets

EFFICIENT TWO-STAGE ASYNCHRONOUS SAMPLE-RATE CONVERTER

BACKGROUND OF THE INVENTION

1. Field of the Invention

This invention relates generally to data transmission systems, and more particularly, to a system of propagating data in a signal stream over plural sample-rate domains.

2. Description of the Related Art

In many systems that process signals (audio, radio, video), it is necessary to pass signal streams from one sample-rate domain to another, i.e., where the sample clock time bases of the two domains are independent. The audio samples in the source domain stream should be converted to create new samples suitable for the destination domain. The algorithm that is used to do this is a sample-rate converter (SRC). There are essentially two approaches to the problems associated with propagation of data between domains that have independent sampling time bases, which generally can be designated as "simple" and "full."

It is to be noted that in the practice of the invention, asynchronous conversion is addressed. Asynchronous conversion is needed when the source and destination sample-rates are not locked together, and synchronous conversion can be used when they are locked. The sample-rates are "locked" when both are derived from the same clock time base.

In a "simple" asynchronous sample-rate converter, samples in the stream are adaptively repeated or deleted as needed to match the sample production rate from the source to the sample consumption rate at the destination. This approach has the problem that significant distortion is caused as a result of instantaneous phase jumps in the asynchronous sample-rate converter output. Unless the source and destination sampling rates are very close, the distortion will be very high. The "full" asynchronous sample-rate converter re-calculates all samples using various methods of interpolation. This approach can provide low distortion, but requires a high computational load.

There is, therefore, a need for a sample-rate converter that exhibits reduced distortion, without requiring a high computational load.

In many systems, e.g., any streamed source such as Bluetooth Advanced Audio Distribution Profile (A2DP), which is a Bluetooth profile that allows for the wireless transmission of stereo audio from an A2DP source (typically a phone or computer) to an A2DP receiver (e.g., a set of Bluetooth headphones or stereo system), or in the realm of internet audio, complexity is increased by the fact that there is not present a physical source and/or destination clock signal. Designs for full asynchronous sample-rate converters require an instantaneous calculation of the ratio of the input sample-rate and the output sample-rate, or they require the addition of a mechanism to estimate a near-instantaneous ratio. Such mechanisms introduce the additional problems of diminished accuracy and an unacceptable settling time of the computed estimate.

There are known practical situations (e.g., Digital Audio Broadcasting (DAB), Bluetooth advanced audio distribution profile audio paths, and any Bluetooth Advanced Audio Distribution Profile path) where distortion performance is somewhere between that of the two aforementioned approaches, and therefore the use of a simple asynchronous sample-rate converter would be inadequate and a full asynchronous sample-rate converter would waste computational resources.

Particularly for hands-free telephone programs, there is a need for advanced audio distribution profile audio performance that has been ignored in the prior art. Such advanced audio distribution profile systems for automotive applications usually simply drop frames or add mutes to cover sample-rate differences, instead of using an asynchronous sample-rate converter. This approach causes undesired user-discernible audio artifacts, such as audio gaps, pops, and glitches.

There is, therefore, a need for a computationally efficient sample-rate converter that reduces undesired user-discernible audio artifacts. There is also a need for a sample-rate converter that can be used in systems where the source and/or destination sample clocks are not available.

SUMMARY OF THE INVENTION

The foregoing and other deficiencies in the art are addressed and overcome by the present invention, which provides a combination of a simple asynchronous sample-rate converter and a synchronous sample-rate converter. A principal aspect of the present invention is to provide a sample-rate converter solution that has reduced artifacts and can be used in systems where both the source and destination sample clocks are not available. The task of the simple asynchronous sample-rate converter is to convert the source rate asynchronously to an intermediate rate that is locked to the destination rate, but is close to the source rate. The synchronous sample-rate converter then converts to the destination rate. Using this approach, since the sample-rate ratio of the simple asynchronous sample-rate converter is close to unity, a minimum number of samples will need to be repeated or deleted in order to minimize distortion. Moreover, the computational load of the synchronous sample-rate converter is much less than that of an asynchronous sample-rate converter with similar distortion performance. The ratio used in the simple asynchronous sample-rate converter can be selected to achieve the desired distortion level.

Methods and systems consistent with the present invention provide an improved sample-rate converter that overcomes the limitations of conventional sample-rate converters. The improved system comprises a simple asynchronous sample-rate converter and synchronous sample-rate converter. The output of the simple asynchronous sample-rate converter is connected to the input of the synchronous sample-rate converter. In an alternative embodiment, the output of the synchronous sample-rate converter is connected to the input of the simple asynchronous sample-rate converter.

In accordance with methods and systems consistent with the present invention, a method is provided for converting samples at an input sample-rate from a source into an output sample-rate. The method receives a plurality of input data from the source, converts the plurality of input samples at the input sample-rate to a plurality of intermediate samples at an intermediate sample-rate, and converts the plurality of intermediate samples at the intermediate sample-rate into a plurality of output samples at the output sample-rate. In the method, the plurality of input samples is converted into the plurality of intermediate samples by inserting a new sample or deleting one of the plurality of input samples, the ratio of the input sample-rate over the intermediate sample-rate is approximately equal to unity, and the intermediate sample-rate and the output sample-rate are locked together.

In accordance with methods and systems consistent with the present invention, a method is provided for converting samples at an input sample-rate from a source into an output sample-rate. The method receives a plurality of input data from the source, converts the plurality of input samples at the input sample-rate to a plurality of intermediate samples at an intermediate sample-rate, and converts the plurality of intermediate samples at the intermediate sample-rate into a plurality of output samples at the output sample-rate. In the method, the input sample-rate and the intermediate sample-rate are locked together, the plurality of intermediate samples is converted into the plurality of output samples by inserting a new sample or deleting one of the plurality of intermediate samples, and the ratio of the intermediate sample-rate over the output sample-rate is approximately equal to unity.

One advantage of the present invention is that, in some embodiments, the synchronous sample-rate converter smoothes the sharp amplitude discontinuities created by the simple asynchronous sample-rate converter stage. This helps to reduce overall distortion in addition to achieving minimization of repeat/delete events, as mentioned above.

The present invention is useful in any system where audio is being streamed and there is no physical source clock, as is the case, for example, in Bluetooth advanced audio distribution profile, digital radio (Digital Audio Broadcasting (DAB), Satellite Digital Audio Radio Services (SDARS), HD Radio), and internet streaming. This invention can also be applied to image and video pixel density conversion as a low-computation real-time conversion solution. This invention also has application in high-capacity audio and image storage and transmission (internet, cloud storage, and related systems).

BRIEF DESCRIPTION OF THE DRAWING

The accompanying drawings, which are incorporated in and constitute a part of this specification, illustrate an implementation of the present invention and, together with the description, serve to explain the advantages and principles of the invention. In the drawings.

DETAILED DESCRIPTION

The present invention is directed to an efficient two-stage asynchronous sample-rate converter. Although described as a sample-based system, one having skill in the art will appreciate that the present invention may transfer data using packets of multiple samples rather than using individual samples.

Figure 1:
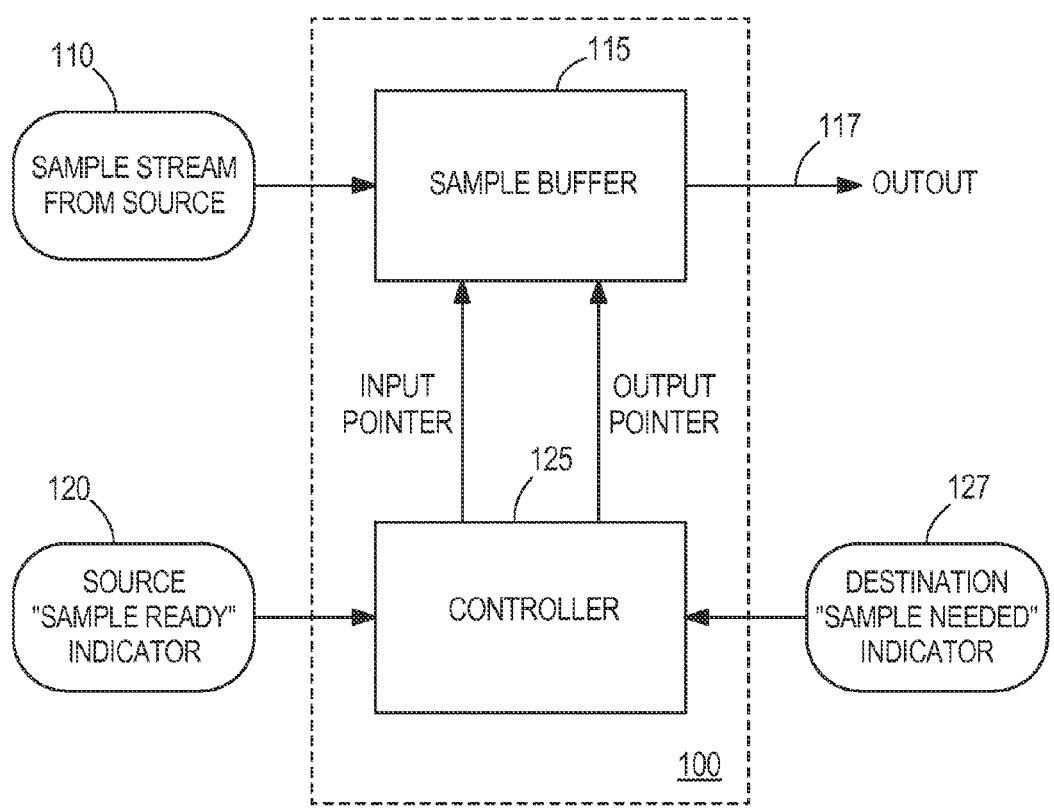
FIG. 1 is a simplified function block representation of a simple prior art asynchronous sample-rate converter system.

FIG. 1 depicts a conventional simple asynchronous sample-rate converter (ASRC) 100. ASRC 100 includes a sample buffer 115 and a controller 125. A source (not shown) provides a stream of sampled data 110 to the sample buffer 115. The sample buffer 115 stores the data until it is transferred out of the buffer at 117. The controller 125 receives a source "sample ready" indicator 120 from the source, and a destination "sample needed" indicator 127 from a downstream system (not shown).

Figure 5:
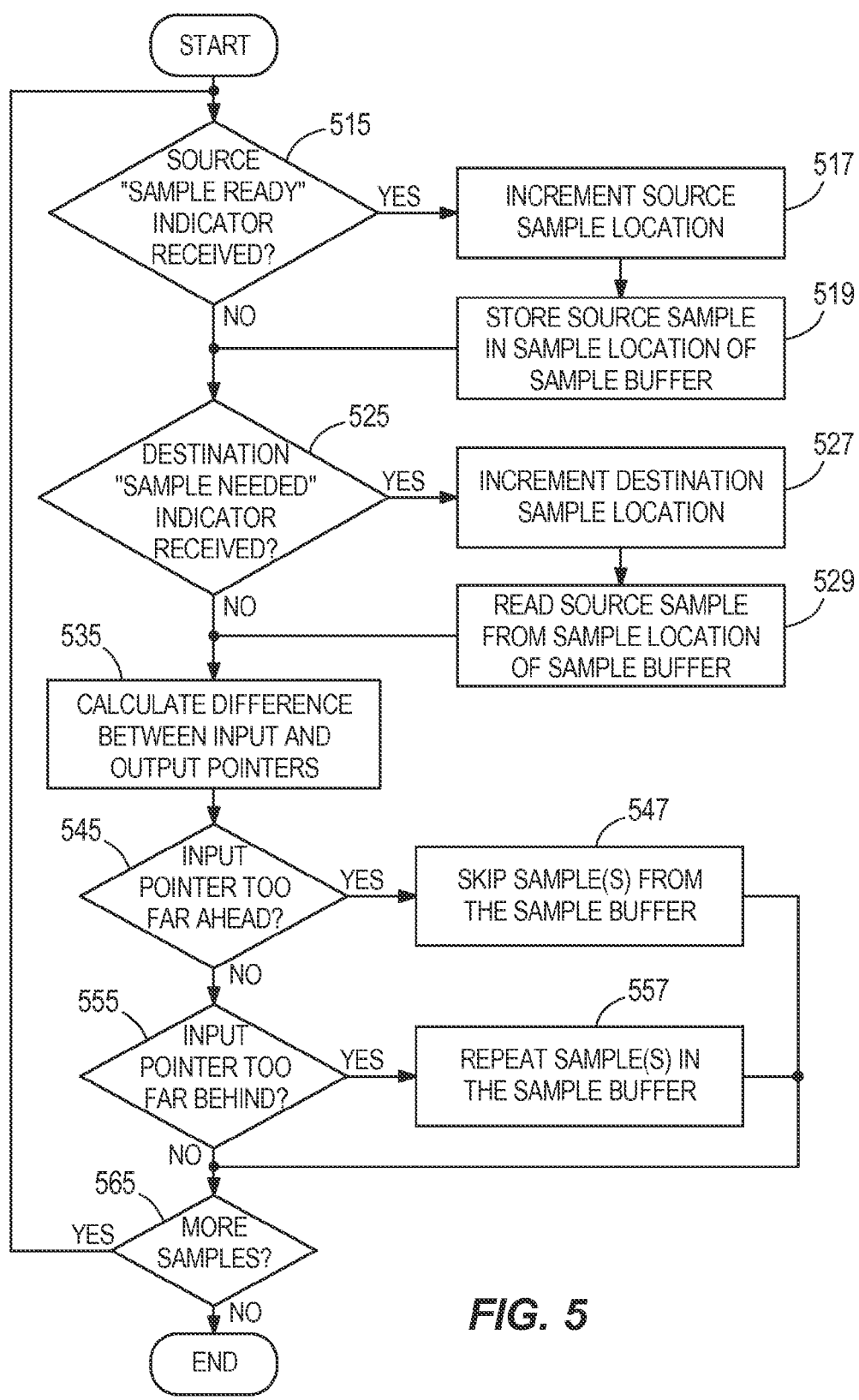
FIG. 5 is a simplified function block representation of an illustrative algorithm that is useful in the operation of the asynchronous sample-rate converter system of FIG. 1.

FIG. 5 depicts an exemplary flow diagram illustrating the operation of ASRC 100. If the controller 125 of ASRC 100 determines that it received a source "sample ready" indicator (step 515), the controller 125 increments the input pointer identifying the source sample location (step 517), and stores a source sample in the source sample location of the sample buffer 115 (step 519). Also, if the controller 125 determines that it received a destination "sample needed" indicator (step 525), the controller 125 increments the output pointer identifying the destination sample location (step 527), and reads a source sample from the destination sample location of the sample buffer 115 (step 529). The controller 125 then calculates the difference between the input and output pointers (step 535), and determines if the input pointer has moved too far ahead of the output pointer (step 545). If the controller 125 determines that the input pointer has moved too far ahead of the output pointer (which will periodically occur if the source data is sampled at a rate that is higher than the sampling rate of the destination), the controller 125 adjusts the output pointer to skip some of the data stored in the sample buffer 115 (step 547), effectively discarding excess incoming samples. To minimize the discontinuity between samples, the controller 125 may perform standard curve-fitting techniques to the samples in close proximity to the discarded samples, as is well known to one having ordinary skill in the art. If the controller 125 does not determine that the input pointer has moved too far ahead of the output pointer, the controller 125 determines if the input pointer has moved too far behind the output pointer (step 555). If the controller 125 determines that the input pointer has moved too far behind the output pointer (which will periodically occur if the source data is sampled at a rate that is lower than the sampling rate of the destination), the controller 125 adjusts the output pointer to repeat some of the data stored in the sample buffer 115 (step 557). Alternatively, to minimize the discontinuity created by repeating samples, the controller 125 may create new samples to be inserted to the sample buffer 115 using standard curve-fitting techniques as is well known to one having ordinary skill in the art. Moreover to further minimize any discontinuity, the controller 125 may smooth those repeated/inserted samples along with additional samples in close proximity to those repeated/inserted samples using standard curve-fitting techniques. If the controller 125 then determines that there are additional samples to process (step 565), it returns to step 515. Otherwise, the process ends.

Figure 2:
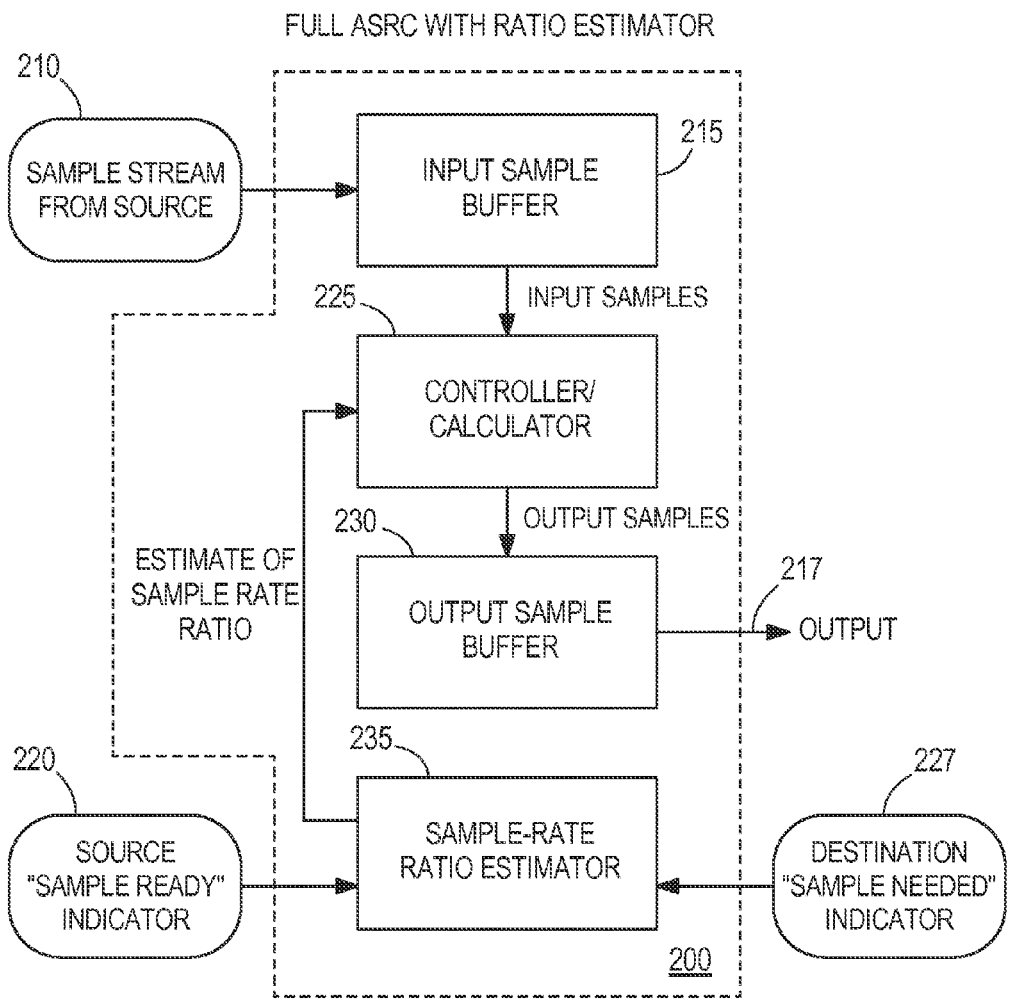
FIG. 2 is a simplified function block representation of a full asynchronous prior art sample-rate converter that uses a sampling rate ratio estimator.

FIG. 2 depicts a conventional full ASRC 200. ASRC 200 includes an input sample buffer 215, a controller/calculator 225, an output sample buffer 230, and a sample-rate ratio estimator 235. A source (not shown) provides a stream of sampled data 210 to the input sample buffer 215. The sample-rate ratio estimator 235 receives a source "sample ready" indicator 220 from the source and a destination "sample needed" indicator 227 from a downstream system (not shown). The controller/calculator 225 also receives the source sample "sample ready" indicator either from the sample-rate ratio estimator 235 or directly from the source (not shown). When the controller/calculator 225 receives the source sample "sample ready" indicator, it increments the input pointer and stores a source sample in the input sample buffer 215 in a similar manner to sample buffer 115 in ASRC 100.

Figure 6:
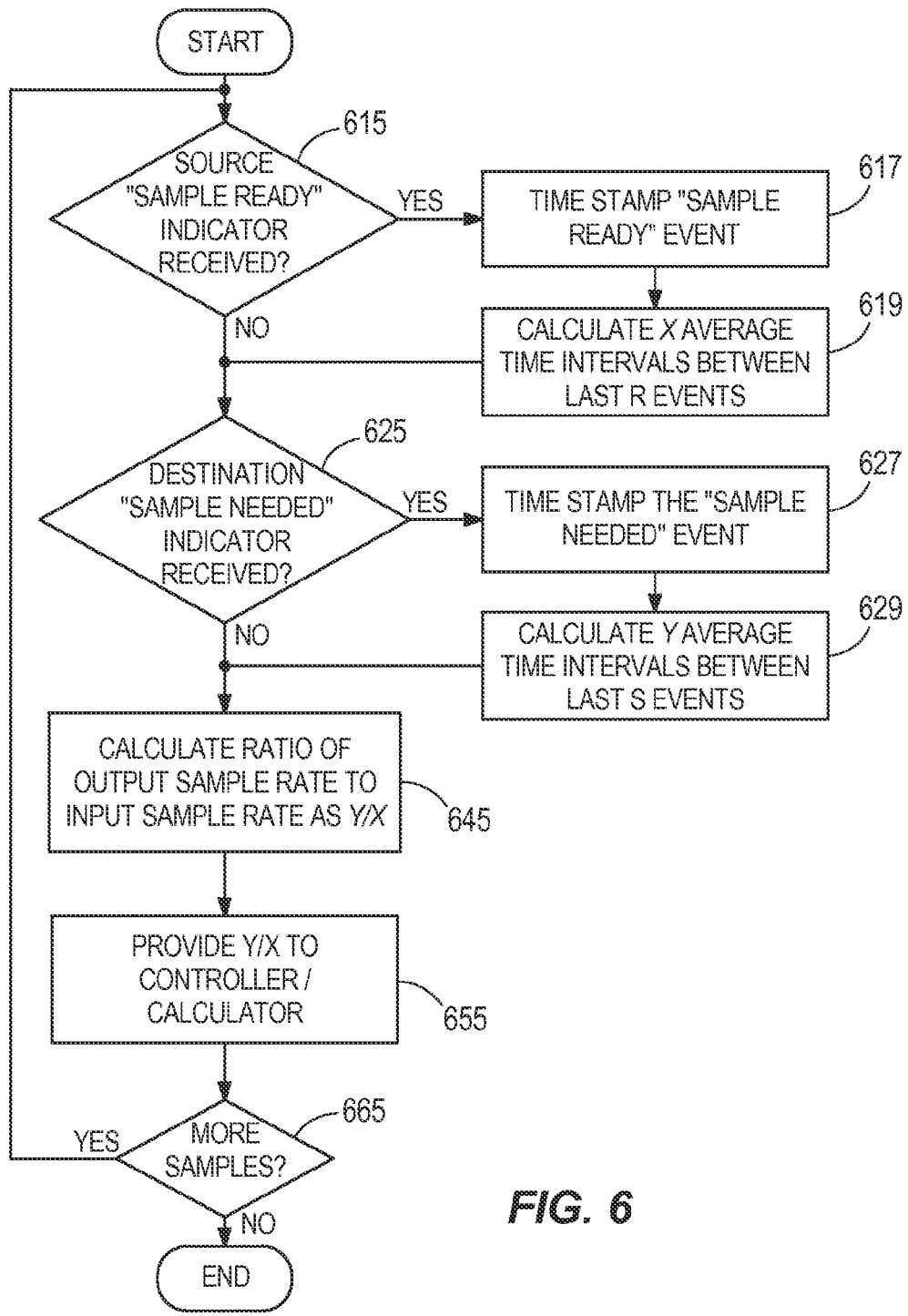
FIG. 6 is a simplified function block representation of an illustrative algorithm that is useful in the operation of full asynchronous sample-rate converter with a sampling rate ratio estimator of FIG. 2.

The sample-rate ratio estimator 235 uses the source "sample ready" indicator 220 and the destination "sample needed" indicator 227 to compute an estimate of the sample-rate ratio (as described more fully in conjunction with FIG. 6). The sample-rate ratio estimator 235 provides the estimate of the sample-rate ratio to the controller/calculator 225, which uses it to control the rate of the output samples 217 from the output sample buffer 230. The sample-rate ratio estimator 235 is only needed when the source and/or the destination streams do not include physical sample clocks.

As discussed above, when the source data is sampled at a rate that is higher than the sampling rate of the destination, excess incoming samples are discarded. Thus, information in the incoming data stream is lost and not delivered to the destination. Conversely, when the source data is sampled at a rate that is lower than the sampling rate of the destination, samples are added. ASRC 200 may add samples by repeating previous samples, by inserting samples with values equal to 0, or by inserting samples with values determined by some other method such as interpolation.

FIG. 6 depicts an exemplary flow diagram illustrating the operation of sample-rate ratio estimator 235. If the sample-rate ratio estimator 235 of ASRC 200 determines that it received a source "sample ready" indicator (step 615), the sample-rate ratio estimator 235 associates a time stamp with the "sample ready" event (step 617), and calculates the average of time periods (i.e., X) between the most recent R "sample ready" events (step 619). Also, if the sample-rate ratio estimator 235 determines that it received a destination "sample needed" indicator (step 625), the sample-rate ratio estimator 235 associates a time stamp with the "sample needed" event (step 627), and calculates the average of time periods (i.e., Y) between the most recent S "sample needed" events (step 629). The sample-rate ratio estimator 235 then calculates the sample-rate ratio (i.e., the ratio of the output sample-rate (Y) to the input sample-rate (X)) (step 645), and provides this value to the controller/calculator 225 (step 655). Values for R and S typically are determined based on a trade-off on how well the estimator tracks changes in the sample-rate ratio in real-time versus how well it minimizes uncertainty in the estimate. If the sample-rate ratio estimator 235 determines that there are additional samples to process (step 665), it returns to step 615. Otherwise, the process ends.

Figure 3:
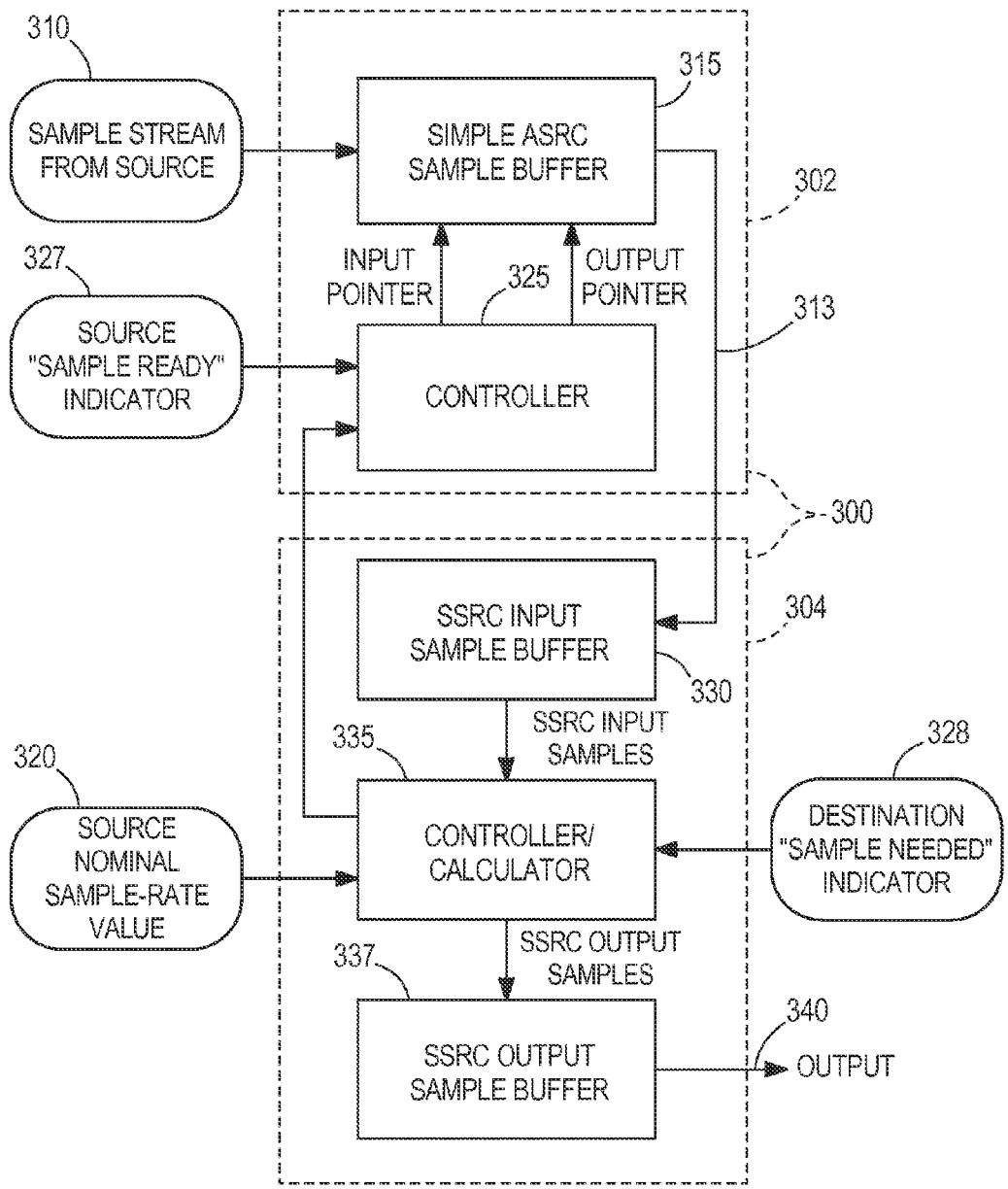
FIG. 3 is a simplified function block representation of an asynchronous sample-rate converter that, in accordance with the invention, uses a combination of a simple asynchronous sample-rate converter followed by a synchronous sample-rate converter.

FIG. 3 depicts an exemplary two-stage asynchronous sample-rate converter 300 consistent with the present invention. Converter 300 includes an ASRC 302 followed by a synchronous sample-rate converter (SSRC) 304. ASRC 302 includes a simple ASRC sample buffer 315 and a controller 325. SSRC 304 includes an SSRC input sample buffer 330, a controller/calculator 335 and an SSRC output sample buffer 337. A source (not shown) provides a stream of sampled data 310 to the simple ASRC sample buffer 315 and a source "sample ready" indicator 327 to the controller 325. Depending on the system, the source sample-rate may be a single, pre-determined sample-rate, or it may be contained in a set of predetermined sample-rates. If it is one of the sample-rates in the set of sample-rates, then the source provides an indication the sample-rate to use from the set of sample-rates (i.e., the source nominal sample-rate value 320) to the controller/calculator 335. The source nominal sample-rate value 320 is generally available as metadata from the source. The controller/calculator 335 also receives a destination "sample needed" indicator 328 from a downstream system (not shown). Controller/calculator 335 outputs N samples for every M samples it receives.

SSRCs, whether simple or full, require less computational resources than full ASRCs. Therefore, all embodiments of the present invention, which combine an SSRC with a simple ASRC, will require less computational resources than a full ASRC. When an SSRC is combined with a simple ASRC, the sample-rate between the simple ASRC and the SSRC (the intermediate sample-rate, $f_{int}$) is chosen to make the ratio of the simple ASRC input sample-rate and output sample-rate close to unity. Such a system is useful where there is no physical source clock.

One having ordinary skill in the art will recognize that there are certain constraints in determining $f_{int}$, N and M in an SSRC. First, $f_{int}$ should be approximately equal to $f_{source}$ (i.e., the simple ASRC input sample-rate). In particular, to minimize distortion, the absolute value of $(f_{int}/f_{source}-1)$ should be less than Q, which is a value determined based on the distortion level. Second, a determining characteristic of SSRCs is that the ratio of $f_{dest}$ (i.e., the SSRC output sample-rate) to $f_{int}$ should equal N/M, where N and M are integers. Finally, $N < N_{max}$, where $N_{max}$ is the maximum allowable value of N so that the complexity of the SSRC is less than some maximum complexity. As is evident to a person having ordinary skill in the art, higher SSRC complexity results in higher hardware cost.

Figure 8:
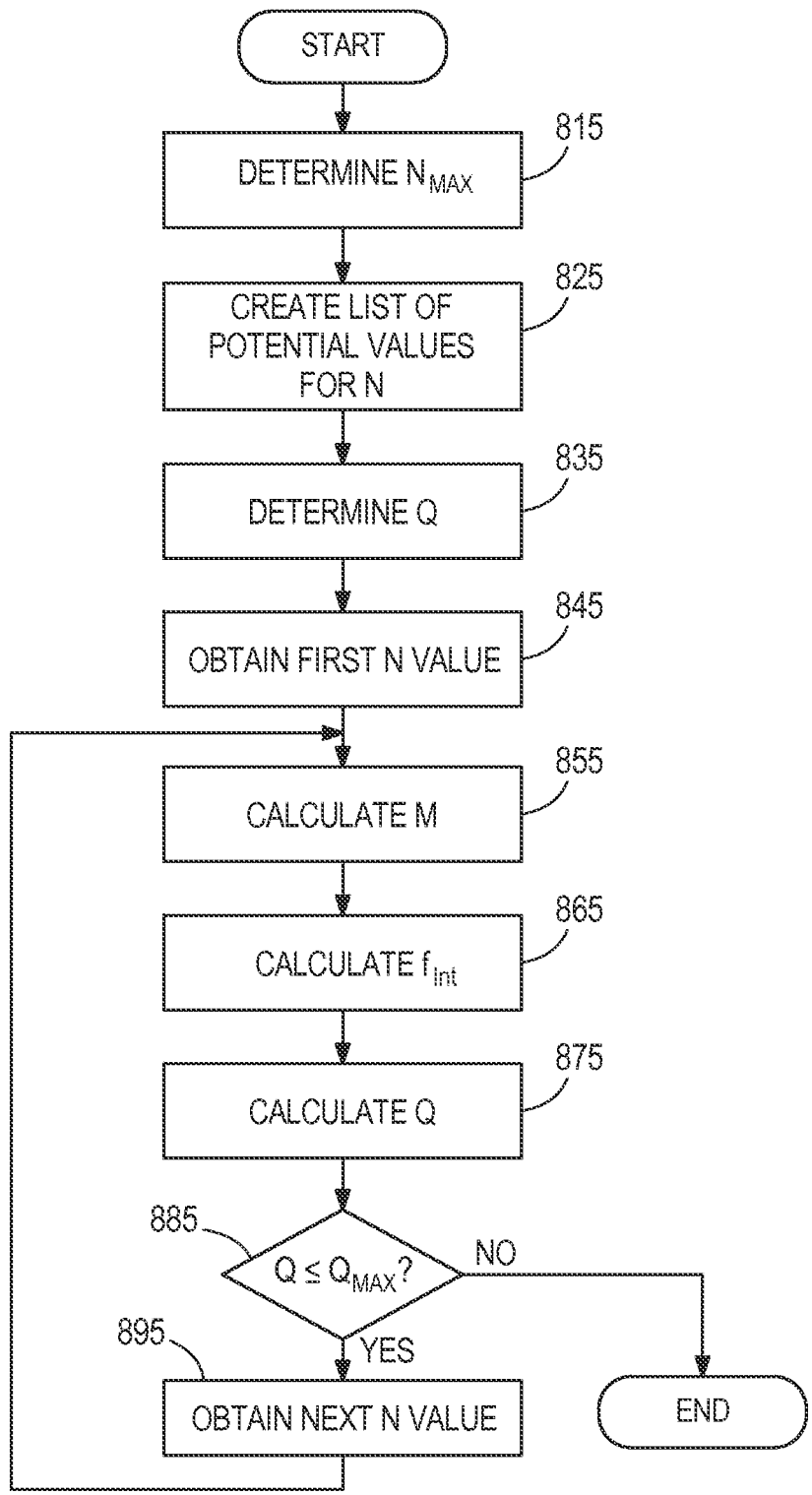
FIG. 8 is a simplified function block representation of an illustrative algorithm that is useful in determining the intermediate sample-rate for a synchronous sample-rate converter.

Potential values for $f_{int}$, N and M may be determined when the system is being designed using the procedure depicted in FIG. 8. After determining $N_{max}$ based on the maximum allowed SSRC complexity (step 815), a list of potential values for N is created (step 825). All potential N values are less than $N_{max}$. The process then determines Q, which is based on the maximum allowable distortion (step 835). After obtaining the first N value from the list (step 845), the process calculates M (step 855) using the following formula:

$$M = \text{round}\left(N * \frac{f_{int}}{f_{dest}}\right)$$

Next, a value for $f_{int}$ is calculated (step 865) using the following formula:

$$f_{int} = f_{dest} * \frac{M}{N}$$

After calculating Q (step 875), the process then determines if Q is less than or equal to $Q_{max}$ (step 885). If Q is less than or equal to $Q_{max}$, then the values for $f_{int}$, N and M are included in the predetermined set of ratios. The process then selects the next N value from the list (step 895), and returns to step 855 to calculate a new value for M. Otherwise, if Q is greater than $Q_{max}$, the process ends.

Returning to FIG. 3, controller/calculator 335 is provided with an intermediate sample-rate ratio, which is selected from the predetermined set of sample-rates at design-time by the design engineer. Based on the intermediate sample-rate ratio, controller/calculator 335 sends an SSRC sample needed indicator 337 to the controller 325. In response, controller 325 sends a sample 313 from simple ASRC sample buffer 315 to SSRC input sample buffer 330. Thus, intermediate sample-rate ratio is the rate at which samples are transferred from the simple ASRC sample buffer 315 to the SSRC input sample buffer 330.

One advantage of the present invention is that the synchronous sample-rate converter smoothes the sharp phase discontinuities created by the sample asynchronous sample-rate converter stage. This helps to reduce overall distortion in addition to the minimization of repeat/delete events already mentioned.

In systems such as Bluetooth advanced audio distribution profile (A2DP), audio streaming and digital audio receivers like digital audio broadcasting (DAB) and high definition (HD) radio, the source rate is provided by the source and is of a limited set of values (e.g., 32 KHz, 44.1 KHz, and 48 KHz), and therefore the sample-rate estimator is not essential to the practice of the invention.

Figure 4:
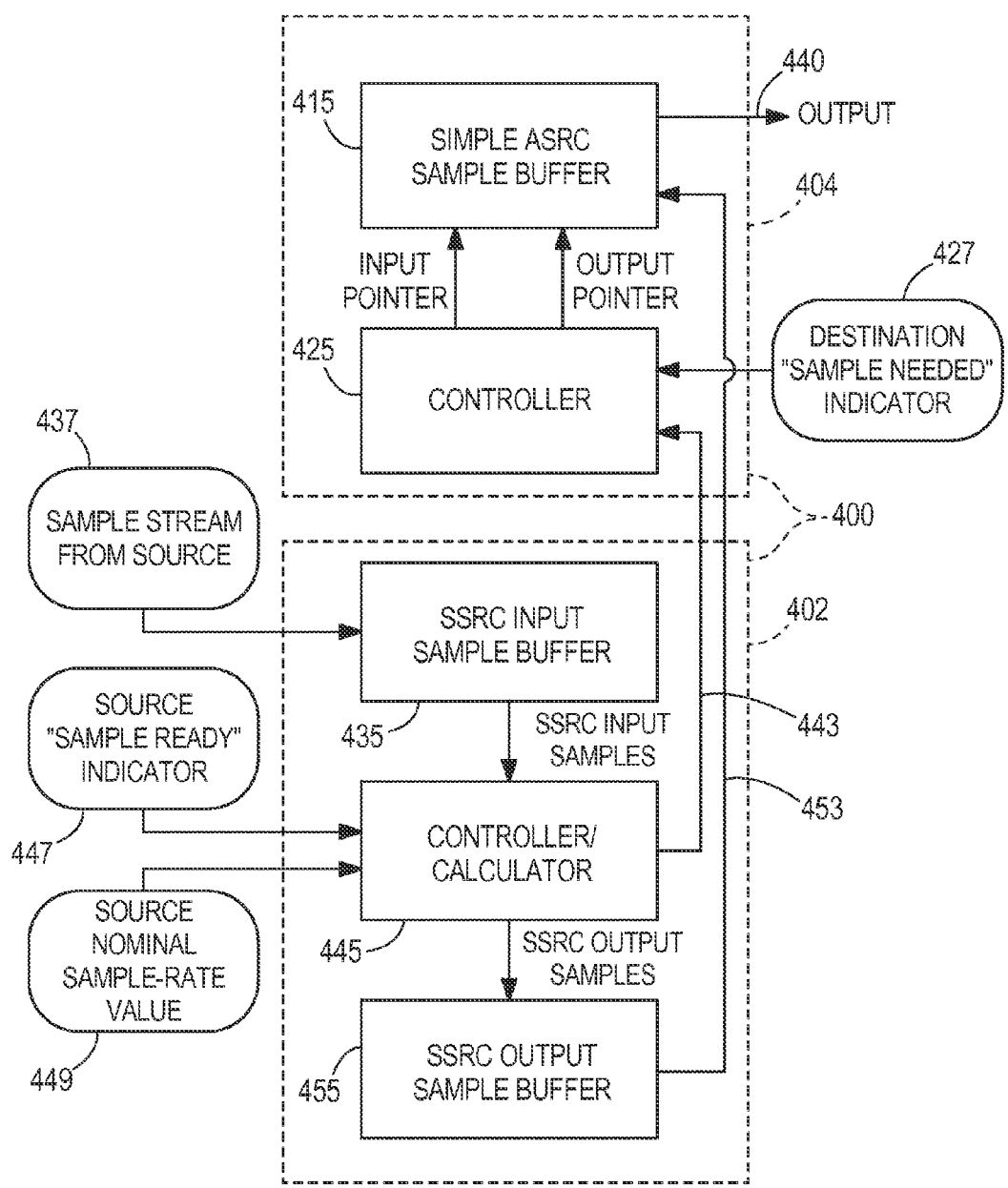
FIG. 4 is a simplified function block representation of an asynchronous sample-rate converter that, in accordance with the invention, uses a combination of a synchronous sample-rate converter followed by a simple asynchronous sample-rate converter.

FIG. 4 depicts another embodiment of a two-stage asynchronous sample-rate converter 400 consistent with the present invention. Converter 400 includes an SSRC 402 followed by ASRC 404. SSRC 402 includes an SSRC input sample buffer 435, a controller calculator 445, and an SSRC output sample buffer 455. ASRC 404 includes a simple ASRC sample buffer 415 and a controller 425. A source (not shown) provides a stream of sampled data 437 to the SSRC input sample buffer 435. The controller/calculator 445 receives a source "sample ready" indicator 447 from the source. Similar to the converter 300 in FIG. 3, if the source sample-rate is contained in a set of sample-rates, then the source provides an indication the sample-rate to use from the set of sample-rates (i.e., the source nominal sample-rate value 449) to the controller/calculator 445. Controller 425 receives a destination "sample needed" indicator 427 from a downstream system (not shown).

In operation, when controller/calculator 445 receives a source "sample ready" indicator 447, it stores a sample into SSRC input sample buffer 435. Similar to the embodiment in FIG. 3, controller/calculator 445 is provided with an intermediate sample-rate ratio, which is selected from the predetermined set of $f_{int}$ at design-time by the design engineer. Based on the intermediate sample-rate ratio, controller/calculator 445 uses samples from SSRC input sample buffer 435 to calculate new samples, which it places into SSRC output sample buffer 455. Controller/calculator 445 then sends an SSRC sample ready indicator 443 to controller 425. In response, controller 425 increments the input pointer and stores a sample from SSRC output sample buffer 455 into simple ASRC sample buffer 415.

Figure 7:
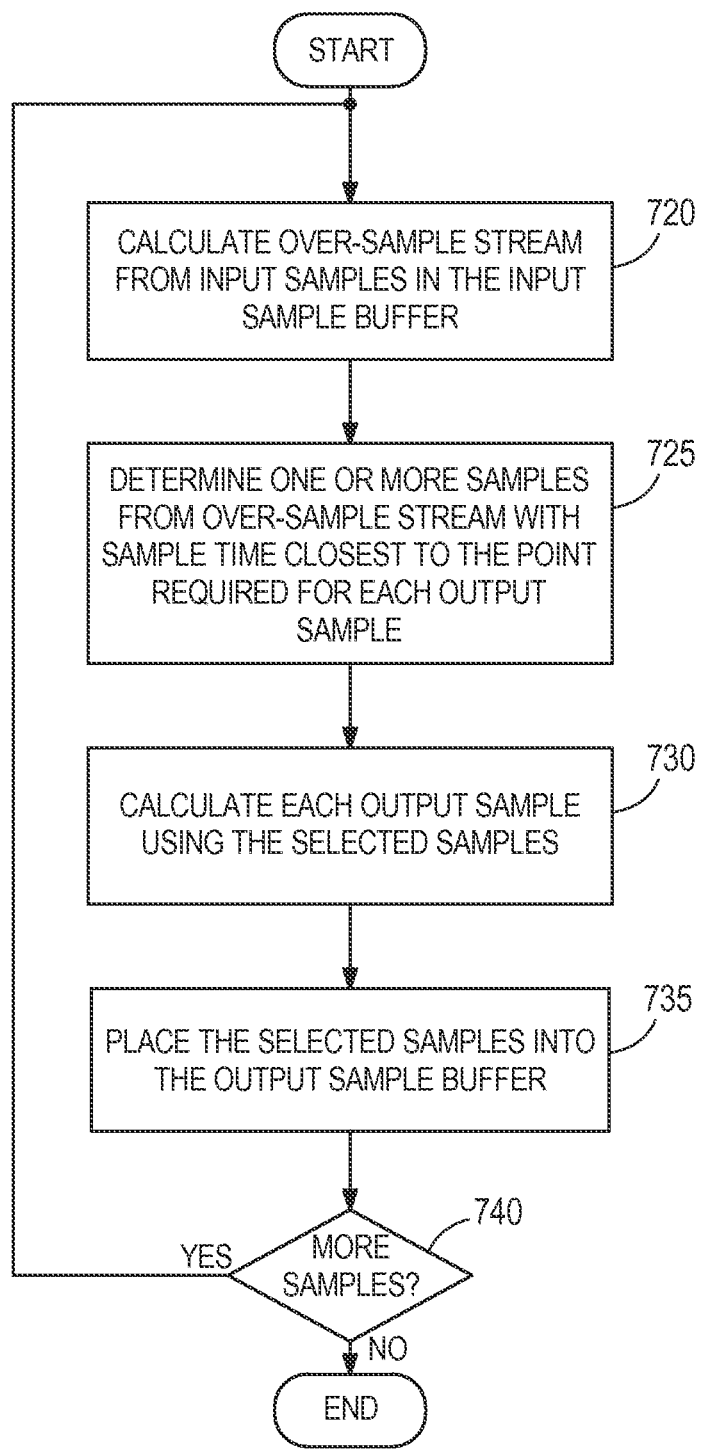
FIG. 7 is a simplified function block representation of an illustrative algorithm that is useful in the operation of a synchronous sample-rate converter that uses a combination of a simple asynchronous sample-rate converter followed by a synchronous sample-rate converter, as shown in FIG. 3.

FIG. 7 is a simplified function block representation of an illustrative methodology that is useful in the operation of the controller/calculator 225 shown in FIG. 2, the controller/calculator 335 shown in FIG. 3, and the controller/calculator 445 shown in FIG. 4. As shown in this figure, controller/calculator calculates the over-sample stream of input samples in the input sample buffer (step 620). The controller/calculator then determines from the over-sample stream which sample or samples are time-stamped with a time that is closest to the time point that is required for each output sample (step 725). These are the selected samples. The controller/calculator uses either the fixed sampling ratio value or the estimated value to determine the output sample values. The specific mathematical calculations for this are known in the art (e.g., poly-phase filtering). The controller/calculator then uses the selected samples to calculate each output sample (step 730). The controller/calculator then places the selected output samples in the output sample buffer (step 735). If there are more samples to process, the method returns to step 720. Otherwise, the process ends.

Although the invention has been described in terms of specific embodiments and applications, persons skilled in the art can, in light of this teaching, generate additional embodiments without exceeding the scope or departing from the spirit of the claimed invention. Accordingly, it is to be understood that the drawing and description in this disclosure are proffered to facilitate comprehension of the invention, and should not be construed to limit the scope thereof. Moreover, the technical effects and technical problems in the specification are exemplary and are not limiting. The embodiments described in the specification may have other technical effects and can solve other technical problems.

What is claimed is:

1. A sample-rate converter system, comprising:
   a simple asynchronous sample-rate converter having an input and an output; and
   a synchronous sample-rate converter having an input and an output, wherein the output of the simple asynchronous sample-rate converter is connected to the input of the synchronous sample-rate converter;
   wherein: (1) the synchronous sample-rate converter comprises a full synchronous sample-rate converter; or (2) the simple asynchronous sample-rate converter has an input sample-rate and an output sample-rate, and the ratio of the input sample-rate over the output sample-rate is approximately equal to unity.

2. The system of claim 1, wherein the synchronous sample-rate converter comprises the full synchronous sample-rate converter.

3. The system of claim 1, wherein the simple asynchronous sample-rate converter has the input sample-rate and the output sample-rate, and the ratio of the input sample-rate over the output sample-rate is approximately equal to the unity.

4. The system of claim 1, wherein the simple asynchronous sample-rate converter comprises a sample buffer and a controller.

5. The system of claim 1, wherein the synchronous sample-rate converter comprises a sample buffer and a controller/calculator.

6. The system of claim 1, wherein the simple asynchronous sample-rate converter comprises a packet buffer and a controller.

7. The system of claim 1, wherein the synchronous sample-rate converter comprises a packet buffer and a controller/calculator.

8. A sample-rate converter system, comprising:
   a synchronous sample-rate converter having an input and an output; and
   a simple asynchronous sample-rate converter having an input and an output, wherein the output of the synchronous sample-rate converter is connected to the input of the simple asynchronous sample-rate converters;
   wherein: (1) the synchronous sample-rate converter comprises a full synchronous sample-rate converter; (2) the simple asynchronous sample-rate converter has an input sample-rate and an output sample-rate, and the ratio of the input sample-rate over the output sample-rate is approximately equal to unity; (3) the simple asynchronous sample-rate converter has an input sample-rate and an output sample-rate, and the ratio of the input sample-rate over the output sample-rate is approximately equal to unity; (4) the synchronous sample-rate converter comprises a sample buffer and a controller/calculator; (5) the simple asynchronous sample-rate converter comprises a packet buffer and a controller; or (6) the synchronous sample-rate converter comprises a packet buffer and a controller/calculator.

9. The system of claim 8, wherein the synchronous sample-rate converter comprises the full synchronous sample-rate converter.

10. The system of claim 8, wherein the simple asynchronous sample-rate converter has the input sample-rate and the output sample-rate, and the ratio of the input sample-rate over the output sample-rate is approximately equal to the unity.

11. The system of claim 8, wherein the simple asynchronous sample-rate converter comprises the sample buffer and the controller.

12. The system of claim 8, wherein the synchronous sample-rate converter comprises the sample buffer and the controller/calculator.

13. The system of claim 8, wherein the simple asynchronous sample-rate converter comprises the packet buffer and the controller.

14. The system of claim 8, wherein the synchronous sample-rate converter comprises the packet buffer and the controller/calculator.

15. A method for converting samples at an input sample-rate from a source into an output sample-rate, comprising the steps of:
   receiving a plurality of input samples from the source;
   converting the plurality of input samples at the input sample-rate to a plurality of intermediate samples at an intermediate sample-rate, wherein the plurality of input samples is converted into the plurality of intermediate samples by inserting a new sample or deleting one of the plurality of input samples, and wherein the ratio of the input sample-rate over the intermediate sample-rate is approximately equal to unity; and
   converting the plurality of intermediate samples at the intermediate sample-rate into a plurality of output samples at the output sample-rate, wherein the intermediate sample-rate and the output sample-rate are locked together.

16. The method of claim 15, further comprising the step of smoothing the samples in close proximity to the inserted or deleted samples.

17. The method of claim 15, wherein the new sample has the same value as one of the input samples directly adjacent to the new sample.

18. The method of claim 15, wherein the step of inserting new samples comprises creating new samples using standard curve-fitting techniques.

19. The method of claim 15, wherein the plurality of intermediate samples is converted into the plurality of output samples using interpolation.

20. The method of claim 15, wherein the samples are transmitted in packets.

21. A method for converting samples at an input sample-rate from a source into an output sample-rate, comprising the steps of:
   receiving a plurality of input samples from the source;
   converting the plurality of input samples at the input sample-rate to a plurality of intermediate samples at an intermediate sample-rate, wherein the input sample-rate and the intermediate sample-rate are locked together; and
   converting the plurality of intermediate samples at the intermediate sample-rate into a plurality of output samples at the output sample-rate, wherein the plurality of intermediate samples is converted into the plurality of output samples by inserting a new sample or deleting one of the plurality of intermediate samples, and wherein the ratio of the intermediate sample-rate over the output sample-rate is approximately equal to unity.

22. The method of claim 21, further comprising the step of smoothing the samples in close proximity to the inserted or deleted samples.

23. The method of claim 21, wherein the new sample has the same value as one of the intermediate samples directly adjacent to the new sample.

24. The method of claim 21, wherein the step of inserting new samples comprises creating new samples using standard curve-fitting techniques.

25. The method of claim 21, wherein the plurality of input samples is converted into the plurality of intermediate samples using interpolation.

26. The method of claim 21, wherein the samples are transmitted in packets.

* * * * *